(12) United States Patent
Ng et al.

(10) Patent No.: US 7,218,141 B2
(45) Date of Patent: May 15, 2007

(54) TECHNIQUES FOR IMPLEMENTING HARDWIRED DECODERS IN DIFFERENTIAL INPUT CIRCUITS

(75) Inventors: Bee Yee Ng, Pahang (MY); Boon Jin Ang, Penang (MY)

(73) Assignee: Altera Corporation, San Jose, CA (US)

( * ) Notice: Subject to any disclaimer, the term of this patent is extended or adjusted under 35 U.S.C. 154(b) by 226 days.

(21) Appl. No.: 11/007,827

(22) Filed: Dec. 7, 2004

(65) Prior Publication Data

US 2006/0119386 A1    Jun. 8, 2006

(51) Int. Cl.
G06F 7/38      (2006.01)
H03K 19/173    (2006.01)
H03K 19/177    (2006.01)
H01L 25/00     (2006.01)

(52) U.S. Cl. .................... 326/41; 326/37; 326/38; 326/39; 326/40; 326/41; 326/47

(58) Field of Classification Search ............ None
See application file for complete search history.

(56) References Cited

U.S. PATENT DOCUMENTS

| | | | |
|---|---|---|---|
| 6,094,375 A | 7/2000 | Lee | |
| 6,275,441 B1 * | 8/2001 | Oh | 365/230.04 |
| 6,353,334 B1 * | 3/2002 | Schultz et al. | 326/82 |
| 6,472,904 B2 | 10/2002 | Andrews et al. | |
| 6,686,769 B1 | 2/2004 | Nguyen et al. | |
| 6,952,115 B1 * | 10/2005 | Andrews et al. | 326/46 |
| 7,106,099 B1 * | 9/2006 | Nix | 326/40 |
| 2002/0190751 A1 * | 12/2002 | Lee et al. | 326/39 |
| 2006/0071691 A1 * | 4/2006 | Garlepp | 326/93 |
| 2006/0072454 A1 * | 4/2006 | Ain et al. | 370/230 |
| 2006/0114022 A1 * | 6/2006 | van Wageningen et al. | 326/40 |
| 2006/0125517 A1 * | 6/2006 | van Wageningen et al. | 326/38 |

OTHER PUBLICATIONS

U.S. Appl. No. 10/444,741, filed May 25, 2003.
"High-Speed Differential I/O Interfaces in Stratix Devices," product handbook S52005 version 3.1, chapter 5, Altera Corporation San Jose, CA (Sep. 2004).
"High-Speed Differential Interfaces in Cyclone II Devices," product handbook CII51011 version 1.1, chapter 11, Altera Corporation San Jose, CA (Nov. 2004).
"High-Speed Differential I/O Interfaces with DPA in Stratix II Devices," product handbook SII52005 version 1.2, chapter 5, Altera Corporation San Jose, CA (Oct. 2004).

* cited by examiner

*Primary Examiner*—Rexford Barnie
*Assistant Examiner*—Dylan White
(74) *Attorney, Agent, or Firm*—Townsend and Townsend and Crew LLP

(57) ABSTRACT

Techniques are provided for improving signal timing characteristics of differential input/output (IO) circuits on programmable logic integrated circuits. A differential buffer receives differential signals applied to differential input pins. The output signals of the differential buffer are routed to two hard IO decoder blocks that are located in two adjacent rows/columns of programmable logic elements. Each IO decoder block has a data-in register that receives output signals of the differential buffer. The data-in registers in two adjacent IO decoder blocks support a double clocking technique. IO decoder blocks of the present invention have reduced setup times, hold times, and sampling windows relative to soft DDIO blocks, and have a minimal impact on die area.

21 Claims, 3 Drawing Sheets

TECHNIQUES FOR IMPLEMENTING HARDWIRED DECODERS IN DIFFERENTIAL INPUT CIRCUITS

BACKGROUND OF THE INVENTION

The present invention relates to techniques for implementing hardwired decoders in differential input circuits, and more particularly, to techniques for decoding differential input signals using hardwired decoders in two adjacent rows/columns of programmable logic elements on a programmable integrated circuit.

Altera Corporation of San Jose, Calif. is a manufacturer of field programmable gate array (FPGA) devices. Stratix® I FPGAs and Stratix II FPGAs are two high end FPGA devices made by Altera. Stratix I FPGAs and Stratix II FPGAs contain hardwired (hard) serializer-deserializer (SERDES) and hard double data rate input/output (DDIO) blocks that target high system interface performance.

Hard SERDES and hard DDIO blocks provide better timing skew and specifications compared to soft SERDES and soft DDIO blocks. The term "soft" refers to building these blocks with programmable logic circuits. Hard DDIO and SERDES blocks also have the advantage of having a larger receiver input skew margin.

Hard SERDES and hard DDIO have not be added to the architecture of Altera's low cost Cyclone™ FPGA in order to save die area. Therefore, core programmable logic circuits and programmable interconnect wires are used to build the soft SERDES blocks needed for the low voltage differential signaling standard (LVDS).

Another challenge for implementing the soft solution on an FPGA relates to achieving the necessary maximum clock frequency. For example, in Cyclone II FPGAs, the LVDS receiver is targeted at 805 Mbps, but the on-chip clock network maximum frequency is only 402.5 MHz. Soft DDIO blocks that use a double clocking method are implemented to overcome this problem. A double clocking method samples data on both the rising and the falling edges of the clock signal, effectively operating at half the LVDS data rate. In Stratix FPGAs that use a hard SERDES architecture, a dedicated hard LVDS clock network is implemented to achieve a maximum frequency running at the same frequency as the LVDS data rate.

Altera's low cost Cyclone FPGAs are able to support a LVDS system interface at a high operating frequency by implementing soft DDIO blocks. However, the receiver input skew margin is small in Cyclone FPGAs, because of the delay caused by the programmable logic elements and the programmable interconnect wires. The small receiver input skew margin is not practical for many board designs.

Each IO decoder in Cyclone FPGAs consists of only three IO registers (on a per port basis). The three IO registers are the data-in register, the data-out register, and the output enable register. In Stratix FPGAs, two additional registers are implemented to support hard DDIO blocks in the IO decoder. These two additional registers were removed in Cyclone FPGAs to save die area.

On Cyclone FPGAs, the edge triggered registers in programmable logic elements are used to build the soft DDIO input registers. In this implementation, the input data path from the IO pins travels from an LVDS input buffer through programmable interconnect wires to the edge triggered registers in programmable logic elements. The programmable interconnect wires and the edge driven registers that receive signals from one pair of differential IO pins are all in the same row or the same column of programmable logic elements.

The path through the programmable interconnect wires causes a larger sampling window and a reduced receiver input skew margin for the following reasons. The input data path is longer, because the programmable interconnect wires are relatively slow. The longer input data path causes a longer propagation delay and increases the setup time (TSU) used to determine the sampling window.

Due to the nature of the FPGA fitting process, not all LVDS channels can be guaranteed to have matched data paths. This causes mismatched propagation delays and widens up the sampling window.

Therefore, it would be desirable to provide techniques for implementing a low cost DDIO scheme that has reduced propagation delays, matched propagation delays between differential signals on multiple channels, and a minimal impact on die area.

BRIEF SUMMARY OF THE INVENTION

The present invention-provides techniques for improving signal timing characteristics of differential input circuits on programmable logic integrated circuits such as FPGAs. According to the present invention, an input buffer receives differential signals applied to differential input pins. The output signals of the input buffer are routed to two hard IO decoder blocks that are located in two adjacent rows/columns of programmable logic elements.

Each IO decoder block has a data-in register that receives output signals of the differential buffer. The data-in registers in two adjacent IO decoder blocks support a double clocking technique. IO decoder blocks of the present invention have reduced setup times, hold times, and sampling windows relative to soft DDIO blocks, and have a minimal impact on die area.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
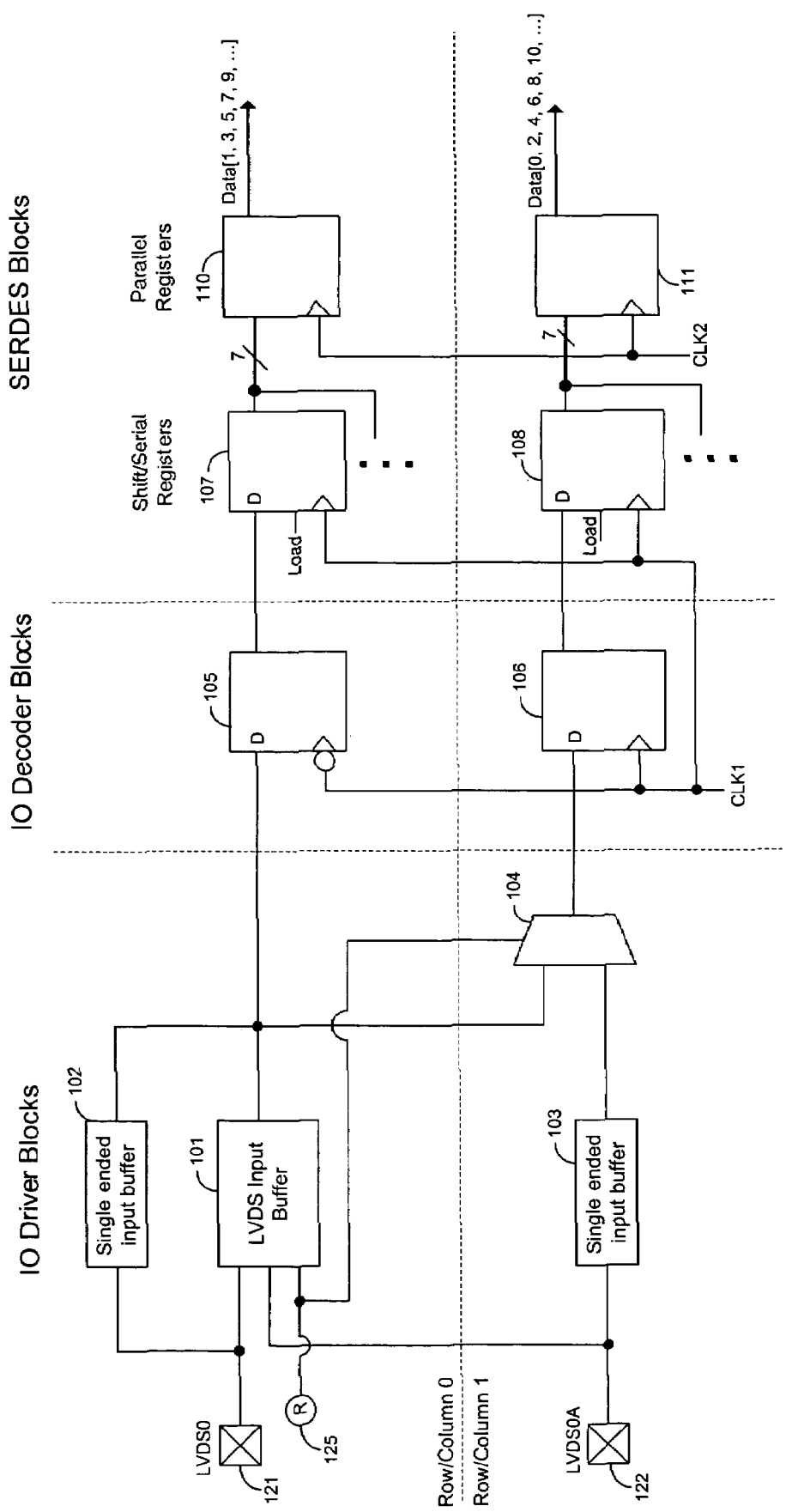
FIG. 1 illustrates a differential input circuitry on a field programmable gate array (FPGA) according to an embodiment of the present invention.

FIG. 1 illustrates input/output (IO) driver blocks, IO decoder blocks, and SERDES blocks in two adjacent rows/columns of logic elements on a field programmable gate array (FPGA) or a programmable logic device (PLD), according to the present invention. Two pins 121 and 122 are shown in FIG. 1. Pins 121 and 122 can be used separately as single ended pins or together as differential pins. Single ended input signals are driven by single ended buffer 102 from pin 121 to flip-flop 105. Single ended input signals are driven by single ended buffer 103 from pin 122 to flip-flop 106 through multiplexer 104.

Differential input signals can be applied to pins 121 and 122 according to the LVDS standard or other standards. LVDS input buffer 101 receives differential input signals applied to pins 121 and 122. Input buffer 101 drives its output signal to flip-flop 105 and to flip-flop 106 through multiplexer 104. The output signal of buffer 101 is single ended.

Multiplexer 104 is a hardwired circuit on the FPGA. Adding one hardwired multiplexer for each set of differential input pins on the FPGA results in a minimal increase in the die area of the integrated circuit.

The select input of multiplexer 104 is controlled by a signal stored in memory 125. The signal in memory 125 determines when multiplexer 104 drives a signal to flip-flop 106 from single ended buffer 103 or from differential buffer 101. The signal in memory 125 is also coupled to an input of buffer 101 (e.g., as an enable signal).

The select input of demultiplexer 104 is controlled by a signal stored in memory 125. The signal in memory 125 determines when demultiplexer 104 drives a signal to flip-flop 106 from single ended buffer 103 or from differential buffer 101. The signal in memory 125 is also coupled to an input of buffer 101 (e.g., as an enable signal).

FIG. 1 illustrates two IO decoder blocks in two adjacent rows/columns programmable logic elements. Each IO decoder block includes a register. The IO decoder block of row/column 0 includes flip-flop 105, and IO decoder block of the row/column 1 includes flip-flop 106. Flip-flops 105 and 106 are hardwired into the circuitry of the FPGA. Flip-flops 105 and 106 are not soft circuits, because they are not programmable. In addition, the wires connecting the IO driver blocks to flip-flops 105 and 106 are hardwired and not programmable. These hardwired connections reduce propagation delays.

In FIG. 1 of the present invention, the IO decoder blocks are associated with two different rows (or two different columns) of programmable logic blocks/elements, although, flip-flops 105 and 106 are not part of programmable logic blocks/elements. As a result, the architecture of FIG. 1 provides a die saving efficiency relative to the prior art architectures, because the registers used for decoding are spread across two rows/columns of logic. Without multiplexer 104, output signals of the differential buffer are driven only to registers in one row/column of programmable logic elements. Therefore, the registers used for decoding are all in the row/column that includes the first pin 121, and registers in the adjacent row/column that includes the second input pin 122 are unused.

Signals are routed from differential input buffer 101 to flip-flops 105/106 in two different rows/columns. One of the IO decoder blocks receives even bits from differential input buffer 101, and the second IO decoder block receives odd bits from differential input buffer 101. The odd numbered bits are latched by flip-flop 105, and the even numbered bits are latched by flip-flop 106. Flip-flop 105 is triggered by falling edges of clock signal CLK1, and flip-flop 106 is triggered by rising edges of clock signal CLK1.

The IO decoder blocks use a double clocking technique that will now be described. The output signal of differential input buffer 101 is continuously applied to the D inputs of both flip-flops 105 and 106 in LVDS mode. On the falling edges of CLK1, flip-flop 105 passes the output signal of buffer 101 to the input of flip-flop 107. On the rising edges of CLK1, flip-flop 106 passes the output signal of buffer 101 to the input of flip-flop 108. In this fashion, the IO decoder blocks separate the even and odd numbered bits from each other.

FIG. 1 also illustrates serial/deserializer (SERDES) blocks in two adjacent rows/columns of programmable logic elements/blocks. The registers in the SERDES blocks of FIG. 1 are implemented in soft programmable logic elements/blocks.

The SERDES blocks includes 2 serial shift registers that are controlled by clock signal CLK1 and a load signal. Each of the two shift registers includes 7 serially coupled flip-flops. FIG. 1 illustrates one flip-flop 107 in the first shift register and a flip-flop 108 in the second shift register. The odd numbered bits are shifted into the first shift register including flip-flop 107, and the even numbered bits are shifted into the second shift register including flip-flop 108.

The odd numbered bits are transferred in parallel from the first serial shift register to a set of parallel registers 110 controlled by clock signal CLK2. Parallel registers 110 output the odd numbered bits Data[1, 3, 5, 7, 9, . . . ] in parallel. The even numbered bits are transferred in parallel from the second serial shift register to a set of parallel registers 111, that are also controlled by clock signal CLK2. Parallel registers 111 output the even numbered bits Data[0, 2, 4, 6, 8, 10, . . . ] in parallel.

Figure 2:
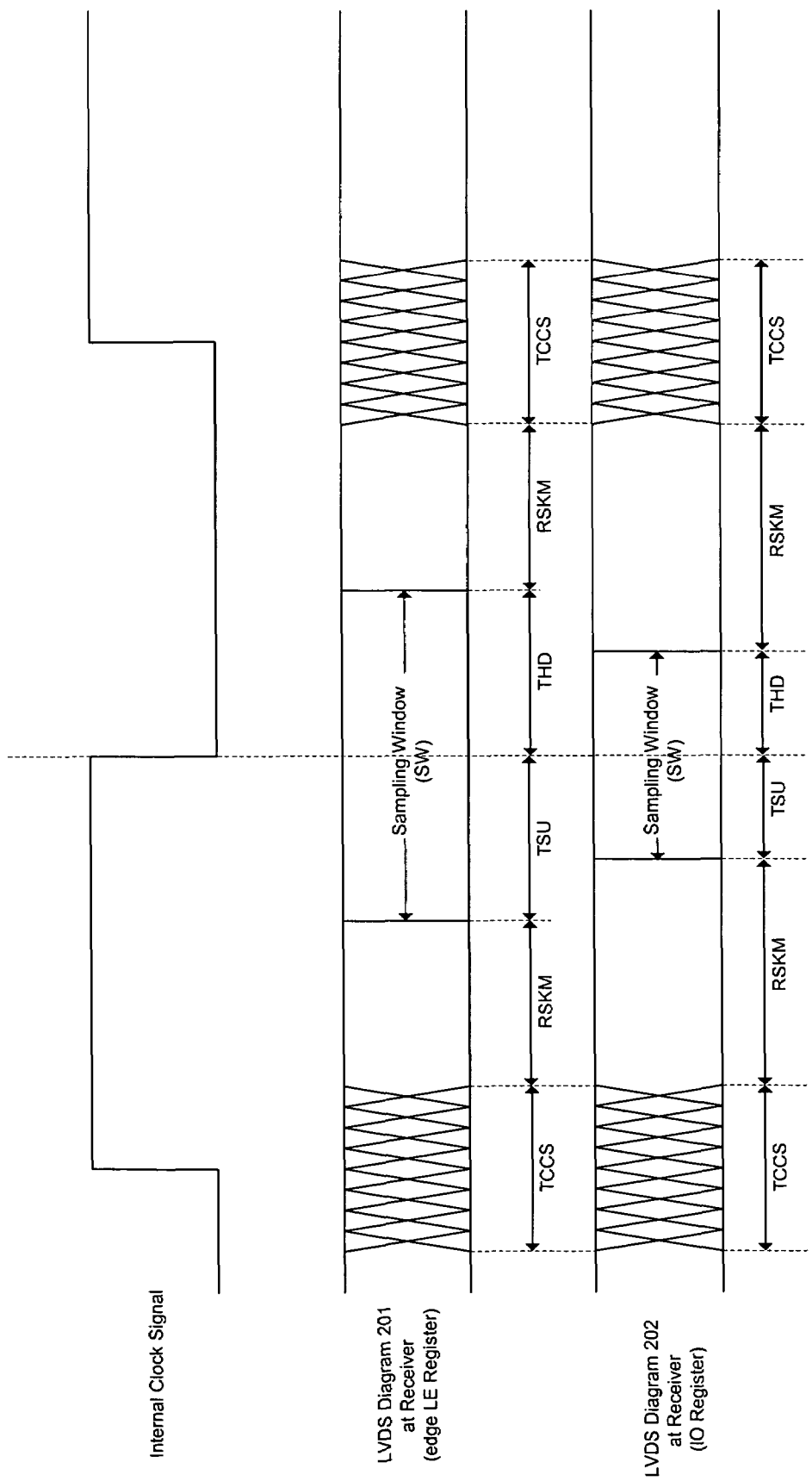
FIG. 2 illustrates a timing diagram for a prior art differential input circuitry and a timing diagram for the input circuitry of FIG. 1.

FIG. 2 has timing diagrams that illustrate differences between the present invention and a prior art soft DDIO block technique. Timing diagram 201 and 202 both illustrate signal delays for LVDSIO systems at the receiver that are clocked by an internal clock signal having a period shown at the top of FIG. 2.

The system generating the signals in diagram 201 has soft DDIO blocks that are implemented by registers in programmable logic elements according to the prior art. The system generating the signals in diagram 202, on the other hand, has hardwired registers in two IO decoder blocks according to the embodiment of FIG. 1.

As can be seen in FIG. 2, the receiver input skew margin (RSKM) for FIG. 1 of the present invention (diagram 202) is substantially longer than the receiver input skew margin (RSKM) for the prior art (diagram 201). Because the registers in the IO decoder blocks and the interconnections coupled to the registers are hardwired in FIG. 1, the setup time (TSU), the hold time (THD), and the sampling window are substantially shorter in a IO block of the present invention.

These improved timing parameters allow the IO circuitry of FIG. 1 to support LVDS input signals at a higher frequency. The present invention also provides improved control in terms of less variations in the sampling window and the maximum clock frequency across all of the LVDS channels.

The present invention saves die size area by implementing a double clocking scheme for a differential IO standard within two IO decoder blocks in two adjacent rows/columns of programmable logic elements. No additional registers need to be added into the IO decoder blocks.

Figure 3:
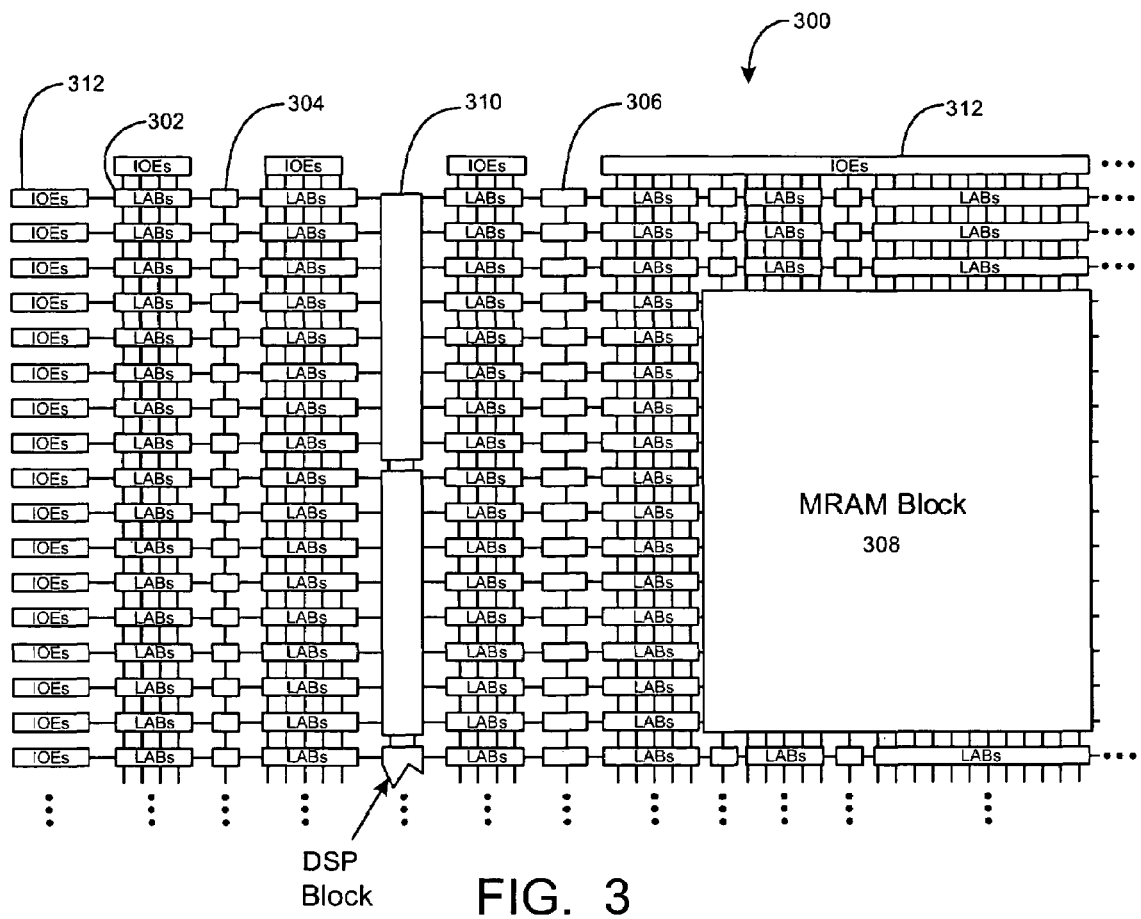
FIG. 3 is a simplified block diagram of a programmable logic device that can be used with the techniques of the present invention.

FIG. 3 is a simplified partial block diagram of one example of PLD 300 that can include aspects of the present invention, such as the embodiment of FIG. 1. Although the present invention is discussed primarily in the context of PLDs and FPGAs, it should be understood that the present invention can be applied to numerous types of programmable logic integrated circuits. PLD 300 is an example of a programmable logic integrated circuit in which techniques of the present invention can be implemented. PLD 300 includes a two-dimensional array of programmable logic array blocks (or LABs) 302 that are interconnected by a network of column and row interconnects of varying length and speed. LABs 302 include multiple (e.g., 10) logic elements (or LEs).

An LE is a programmable logic block that provides for efficient implementation of user defined logic functions. PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 300 also includes a distributed memory structure including RAM blocks of varying sizes provided throughout the array. The RAM blocks include, for example, 512 bit blocks 304, 4K blocks 306, and a block 308 providing 512K bits of RAM. These memory blocks can also include shift registers and FIFO buffers.

PLD 300 further includes digital signal processing (DSP) blocks 310 that can implement, for example, multipliers with add or subtract features. I/O elements (IOEs) 312 located, in this example, around the periphery of the device support numerous single-ended and differential I/O standards. It is to be understood that PLD 300 is described herein for illustrative purposes only and that the present invention can be implemented in many different types of PLDs, FPGAs, and the like.

Figure 4:
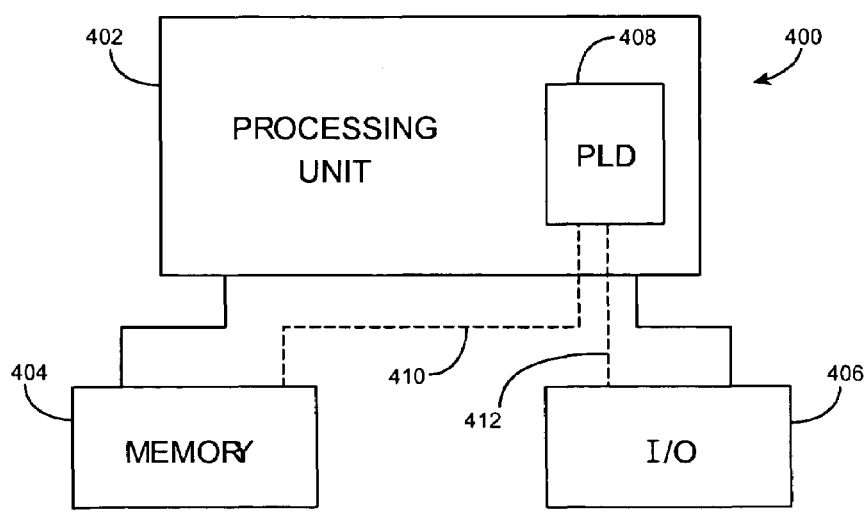
FIG. 4 is a block diagram of an electronic system that can implement embodiments of the present invention.

While PLDs of the type shown in FIG. 3 provide many of the resources required to implement system level solutions, the present invention can also benefit systems wherein a PLD is one of several components. FIG. 4 shows a block diagram of an exemplary digital system 400, within which the present invention can be embodied. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404 and an I/O unit 406 interconnected together by one or more buses. According to this exemplary embodiment, a programmable logic device (PLD) 408 is embedded in processing unit 402. PLD 408 can serve many different purposes within the system in FIG. 4. PLD 408 can, for example, be a logical building block of processing unit 402, supporting its internal and external operations. PLD 408 is programmed to implement the logical functions necessary to carry on its particular role in system operation. PLD 408 can be specially coupled to memory 404 through connection 410 and to I/O unit 406 through connection 412.

Processing unit 402 can direct data to an appropriate system component for processing or storage, execute a program stored in memory 404 or receive and transmit data via I/O unit 406, or other similar function. Processing unit 402 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 408 can control the logical operations of the system. In an embodiment, PLD 408 acts as a reconfigurable processor, which can be reprogrammed as needed to handle a particular computing task. Alternately, programmable logic device 408 can itself include an embedded microprocessor. Memory unit 404 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A programmable logic integrated circuit having input circuitry, the input circuitry comprising:
    a differential input buffer having inputs coupled to first and second differential input pins;
    a first hardwired decoder circuit coupled to an output of the differential input buffer, wherein the first hardwired decoder circuit is in a first row/colunn of programmable logic elements;
    a second hardwired decoder circuit in a second row/column of programmable logic elements; and
    a hardwired multiplexer having a first input coupled to the output of the differential input buffer and having an output coupled to the second hardwired decoder circuit.

2. The programmable logic integrated circuit according to claim 1 wherein the first hardwired decoder circuit has a first register that stores output signals of the differential input buffer on falling edges of a clock signal, and the second hardwired decoder circuit has a second register that stores output signals of the differential input buffer on rising edges of the clock signal.

3. The programmable logic integrated circuit according to claim 2 wherein a connection between the first hardwired decoder circuit and the output of the differential input buffer is hardwired, and a connection between the second hardwired decoder circuit and the output of the hardwired multiplexer is hardwired.

4. The programmable logic integrated circuit according to claim 3 wherein the input circuitry further comprises:
    serializer-deserializer (SERDES) blocks coupled to the first and second hardwired decoder circuits, the SERDES blocks being implemented in programmable logic elements.

5. The programmable logic integrated circuit according to claim 4 wherein each of the SERDES blocks includes serial shift registers and a set of parallel registers.

6. The programmable logic integrated circuit according to claim 2 wherein even numbered bits generated by the differential input buffer are stored in the first register, and odd numbered bits generated by the differential input buffer are stored in the second register.

7. The programmable logic integrated circuit according to claim 1 wherein the input circuitry further comprises:
    a first single ended input buffer coupled to the first differential input pin and the first hardwired decoder circuit; and a second single ended input buffer coupled to the second differential input pin and a second input of the hardwired multiplexer.

8. The programmable logic integrated circuit according to claim 7 wherein a select input of the hardwired multiplexer is coupled to receive a signal that determines when the hardwired multiplexer outputs a signal from the differential input buffer or the second single ended input buffer, and wherein the signal is also coupled to an input of the differential input buffer.

9. The programmable logic integrated circuit according to claim 1 wherein the differential input buffer is configured to receive signals according to a low voltage differential signaling standard.

10. The programmable logic integrated circuit according to claim 1 wherein the programmable logic integrated circuit is part of a system that includes a processing unit, a memory unit, and an input/output unit.

11. A method for decoding differential input signals in a programmable logic integrated circuit, the method comprising:
receiving differential input signals at first and second differential pins;
buffering the differential input signals at a differential input buffer;
storing output signals of the differential input buffer in a first hard decoder block located in a first row/column of programmable logic elements;
coupling an output of the differential input buffer to a second hard decoder block located in a second row/column of programmable logic elements through a hardwired multiplexer during a differential signaling mode; and
storing output signals of the differential input buffer in the second hard decoder block.

12. The method defined in claim 11 wherein storing the output signals of the differential input buffer in the first hard decoder block further comprises storing the output signals in a first register on falling edges of a clock signal.

13. The method defined in claim 12 wherein storing the output signals of the differential input buffer in the second hard decoder block further comprises storing the output signals in a second register on rising edges of a clock signal.

14. The method defined in claim 11 wherein a connection between the first hard decoder block and the differential input buffer and a connection between the second hard decoder block and an output of the hardwired multiplexer are not user programmable.

15. The method defined in claim 14 further comprising:
converting the output signals of the first and the second hard decoder block to parallel data streams using SERDES blocks implemented in programmable logic elements.

16. The method defined in claim 11 further comprising:
buffering single ended signals received at the first differential pin using a first single ended input buffer; and
buffering single ended signals received at the second differential pin using a second single ended input buffer.

17. The method defined in claim 16 further comprising:
storing output signals of the first single ended input buffer in a first register of the first hard decoder block; and
storing output signals of the second single ended input buffer in a second register of the second hard decoder block.

18. The method defined in claim 11 wherein even numbered bits generated by the differential input buffer are stored in the first register, and odd numbered bits generated by the differential input buffer are stored in the second register.

19. A programmable logic integrated circuit comprising:
differential input pins for receiving differential input signals applied to the programmable logic integrated circuit from an external source;
a differential buffer coupled to the differential input pins;
a hardwired multiplexer coupled to an output of the differential input buffer;
first means for storing the output signals of the differential input buffer on falling edges of a clock signal, the first means being located in a first row/column of programmable logic elements; and
second means for storing the output signals of the differential input buffer on rising edges of the clock signal, the second means being coupled to an output of the hardwired multiplexer and being located in a second row/column of programmable logic elements.

20. The programmable logic integrated circuit according to claim 19 further comprising:
serializer-deserializer (SERDES) blocks coupled to the first and second means, the SERDES block being implemented in programmable logic elements.

21. The programmable logic integrated circuit according to claim 19 further comprising:
first and second single ended input buffers coupled to inputs of the hardwired multiplexer.

* * * * *